(12) United States Patent
Matsui et al.

(10) Patent No.: US 9,443,878 B2
(45) Date of Patent: Sep. 13, 2016

(54) DISPLAY DEVICE AND METHOD OF MANUFACTURING DISPLAY DEVICE

(71) Applicant: JOLED INC., Tokyo (JP)

(72) Inventors: Masafumi Matsui, Kyoto (JP); Kouhei Ebisuno, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/404,785

(22) PCT Filed: Jun. 24, 2013

(86) PCT No.: PCT/JP2013/003919
§ 371 (c)(1),
(2) Date: Dec. 1, 2014

(87) PCT Pub. No.: WO2014/002463
PCT Pub. Date: Jan. 3, 2014

(65) Prior Publication Data
US 2015/0155302 A1    Jun. 4, 2015

(30) Foreign Application Priority Data

Jun. 25, 2012 (JP) ................. 2012-142455

(51) Int. Cl.
*H01L 27/14* (2006.01)
*H01L 29/04* (2006.01)
(Continued)

(52) U.S. Cl.
CPC ....... *H01L 27/124* (2013.01); *G02F 1/136259* (2013.01); *H01L 27/3248* (2013.01);
(Continued)

(58) Field of Classification Search
CPC ............. H01L 27/124; H01L 27/1244; H01L 27/3276; H01L 27/3248; H01L 51/56; H01L 51/021; H01L 51/023; H01L 51/031; H01L 2251/568; G02F 1/136259; G02F 2001/136263; G02F 2001/136272
USPC ....... 257/72, 91, 208, E23.171; 349/192, 54, 349/55, 139; 438/4
See application file for complete search history.

(56) References Cited

U.S. PATENT DOCUMENTS 5,260,818 A * 11/1993 Wu ................................ 349/55
6,104,450 A *  8/2000 Hiraishi ........................ 349/48
(Continued)

FOREIGN PATENT DOCUMENTS

JP   03-182723   8/1991
JP   10-142577   5/1998
(Continued)

OTHER PUBLICATIONS

Search report from PCT/JP2013/003919, mail date is Sep. 10, 2013.

*Primary Examiner* — Fernando L Toledo
*Assistant Examiner* — Aaron Gray
(74) *Attorney, Agent, or Firm* — Greenblum & Bernstein, P.L.C.

(57) ABSTRACT

A display device includes a lower wiring layer, an interlayer insulating layer, and an upper wiring layer. The lower wiring layer includes first partial electrode portions, first cuttable portions, and first openings; the upper wiring layer includes second partial electrode portions, second cuttable portions, and second openings. The first partial electrode portions and the second partial electrode portions are disposed in overlapping positions in the stacking direction; all the first cuttable portions and the second openings are disposed in overlapping positions in the stacking direction; all the second cuttable portions and the first openings are disposed in overlapping positions in the stacking direction.

8 Claims, 10 Drawing Sheets

(51) Int. Cl.
*H01L 29/15* (2006.01)
*H01L 31/036* (2006.01)
*H01L 29/205* (2006.01)
*H01L 33/00* (2010.01)
*H01L 23/52* (2006.01)
*H01L 21/00* (2006.01)
*G02F 1/1333* (2006.01)
*G02F 1/1343* (2006.01)
*G02F 1/13* (2006.01)
*H01L 27/12* (2006.01)
*G02F 1/1362* (2006.01)
*H01L 27/32* (2006.01)
*H01L 51/56* (2006.01)
*H01L 51/00* (2006.01)

(52) U.S. Cl.
CPC ........... *H01L27/3276* (2013.01); *H01L 51/56* (2013.01); *G02F 2001/136263* (2013.01); *H01L 51/0021* (2013.01); *H01L 51/0023* (2013.01); *H01L 51/0031* (2013.01); *H01L 2251/568* (2013.01)

(56) References Cited

U.S. PATENT DOCUMENTS

| | | | |
|---|---|---|---|
| 6,335,771 | B1 | 1/2002 | Hiraishi |
| 7,271,427 | B2 | 9/2007 | Tsubokura et al. |
| 8,274,621 | B2 | 9/2012 | Nakagawa |
| 2006/0043406 | A1 | 3/2006 | Tsubokura |
| 2010/0014030 | A1* | 1/2010 | Lin ................................ 349/84 |
| 2010/0177270 | A1* | 7/2010 | Nakagawa .................... 349/141 |

FOREIGN PATENT DOCUMENTS

| | | |
|---|---|---|
| JP | 2003-156763 | 5/2003 |
| JP | 2004-347891 | 12/2004 |
| JP | 2005-215094 | 8/2005 |
| JP | 2006-073370 | 3/2006 |
| JP | 2008-205451 | 9/2008 |
| JP | 2009-175476 | 8/2009 |
| WO | 2008/152757 | 12/2008 |

* cited by examiner

DISPLAY DEVICE AND METHOD OF MANUFACTURING DISPLAY DEVICE

TECHNICAL FIELD

The present disclosure relates to display devices and methods of manufacturing a display device.

BACKGROUND ART

In general, display devices have a structure in which wires having different potentials are stacked in a panel periphery in which electronic elements such as thin-film transistors are arranged. For example, a display device has a structure in which a first power supply line for supplying power supply voltage to a thin-film transistor and a second power supply line for supplying, to an organic EL element, a voltage different from the voltage supplied by the first power supply line are stacked via an insulating film. As such, when a conductive foreign object or a pinhole is formed between the wires having different potentials in the manufacturing process, an interwire short circuit may occur which could hinder panel driving and cause deterioration of panel yield.

In order to avoid such a problem, a wiring layout that allows an interwire short circuit to be resolved (repaired) even after auxiliary wire formation, for example, has been proposed (see Patent Literature (PTL) 1, for example). In PTL 1, an interwire short circuit is resolved by providing, at a three-dimensional crossing point between an auxiliary wire and a signal wire such as DSL or WS having a different potential from the auxiliary wire, an opening in one of the wires and cutting the other wire, via the opening, by laser

CITATION LIST

Patent Literature

[PTL 1] Japanese Unexamined Patent Application Publication No. 2009-175476

SUMMARY OF INVENTION

Technical Problem

The present disclosure has as an object to provide a display device and a method of manufacturing the display device which are capable of resolving a short circuit defect while suppressing an increase in wiring resistance.

Solution to Problem

A display device according to an aspect of the present disclosure includes: a first electrode set to a first potential; an interlayer insulating layer stacked above the first electrode; a second electrode stacked above the interlayer insulating layer and set to a second potential different from the first potential; and a display area including a pixel electrode, wherein the first electrode includes: a plurality of first partial electrode portions; a plurality of first cuttable portions that are cuttable by irradiation with a laser beam; and a plurality of first openings, the second electrode includes: a plurality of second partial electrode portions; a plurality of second cuttable portions that are cuttable by irradiation with the laser beam; and a plurality of second openings, the first partial electrode portions and the second partial electrode portions are disposed in overlapping positions in a stacking direction via the interlayer insulating layer, the first cuttable portions and the second openings are disposed in overlapping positions in the stacking direction via the interlayer insulating layer, the second cuttable portions and the first openings are disposed in overlapping positions in the stacking direction via the interlayer insulating layer, and the first potential is a high-side potential applied to a pixel circuit provided in the display area, and the second potential is a low-side potential applied to the pixel circuit.

Advantageous Effects of Invention

The present disclosure can provide a display device and a method of manufacturing the display device which are capable of resolving a short circuit defect while suppressing an increase in wiring resistance.

DESCRIPTION OF EMBODIMENTS

Hereinafter, embodiments are discussed in detail with reference to drawings as necessary. However, there are instances where excessively detailed description is omitted. For example, there are instances where detailed description of well-known matter and redundant description of substantially identical components are omitted. This is to facilitate understanding by a person of ordinary skill in the art by avoiding unnecessary verbosity in the subsequent description.

It is to be noted that the accompanying drawings and subsequent description are provided by the inventors to allow a person of ordinary skill in the art to sufficiently understand the present disclosure, and are thus not intended to limit the scope of the subject matter recited in the Claims.

(Underlying Knowledge Forming the Basis of the Present Disclosure)

Figure 1:
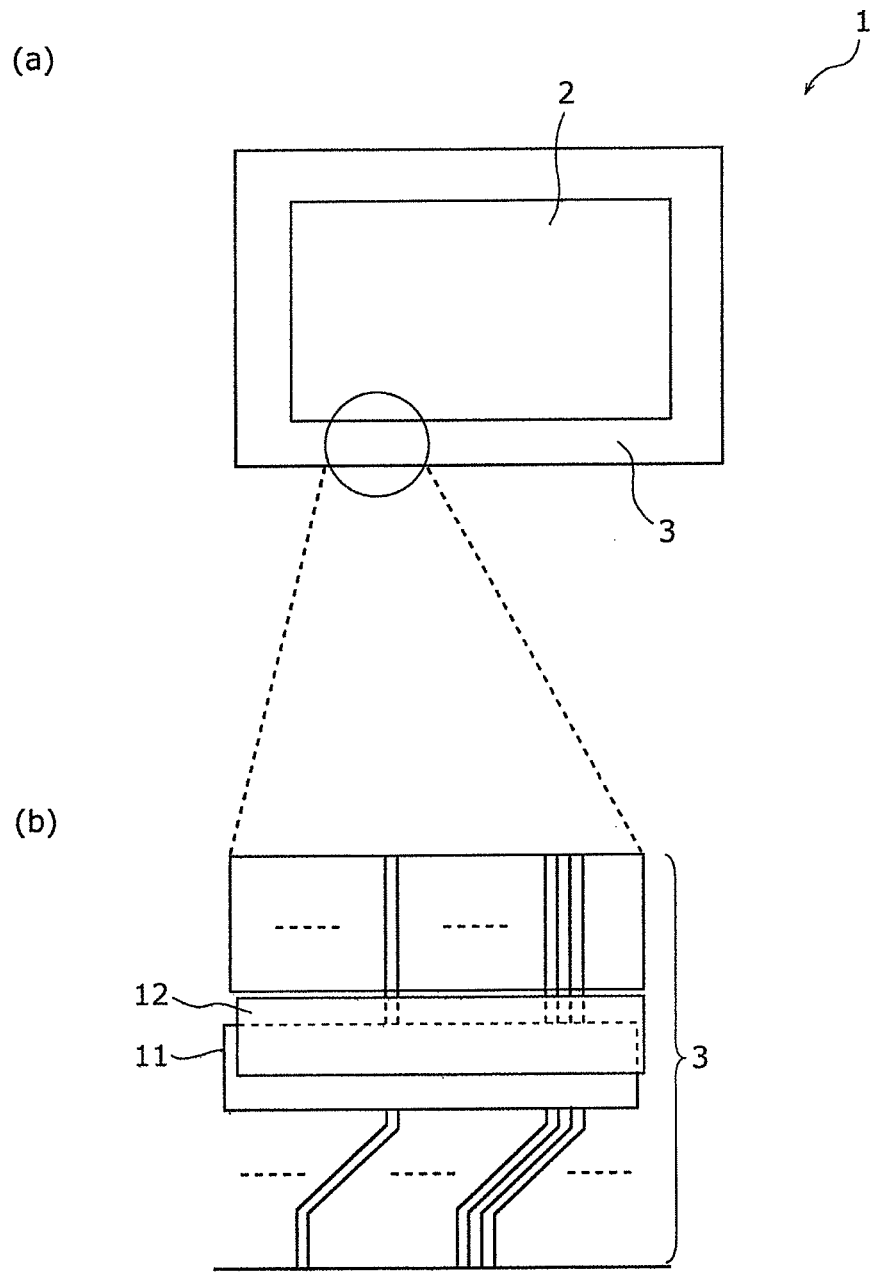
FIG. 1 is a top view of a display device, for describing underlying knowledge forming the basis of the present disclosure, where (a) is a top view of the display device and (b) is an enlarged view of a portion of (a).
Figure 2:
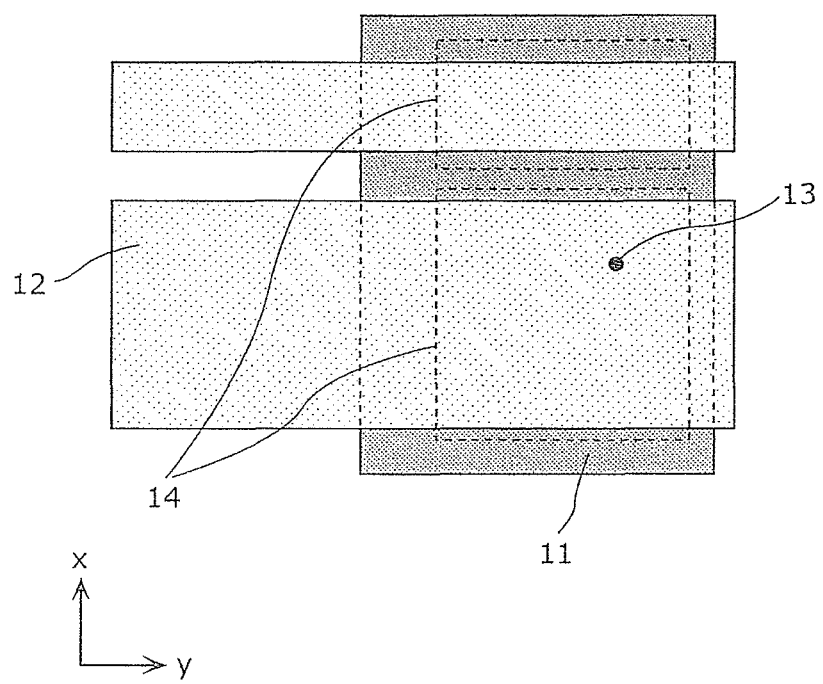
FIG. 2 is an enlarged view of a panel periphery of the display device illustrated in FIG. 1.

Underlying knowledge forming the basis of the present disclosure is described below prior to describing details of the present disclosure. FIG. 1 is a top view of a display device, for describing the underlying knowledge forming the basis of the present disclosure, and FIG. 2 is an enlarged view of a panel periphery of the display device illustrated in FIG. 1. In FIG. 1, (a) is a top view of the display device, and (b) is an enlarged view of a portion of (a).

As illustrated in (a) in FIG. 1, a display device 1 includes a display area 2, and a panel periphery 3. Pixels each including, for example, a display element such as an organic EL element are arranged in a matrix in the display area 2. Furthermore, a lower wiring layer 11 and an upper wiring layer 12 are arranged in overlapping positions in a stacking direction in the panel periphery 3, as illustrated in (b) in FIG. 1 and FIG. 2.

As illustrated in FIG. 2, the lower wiring layer 11 and the upper wiring layer 12 in the panel periphery 3 are stacked in such a way that the upper wiring layer 12 three-dimensionally crosses above the lower wiring layer 11 via an interlayer insulating film (not illustrated). In other words, the upper wiring layer 12 is formed above the lower wiring layer 11 so as to extend in a direction (y direction indicated in FIG. 2) that crosses the direction (x direction indicated in FIG. 2) in which the lower wiring layer 11 extends. However, the directions in which the lower wiring layer 11 and the upper wiring layer 12 are formed are not particularly limited. Here, if, for some reason, conduction occurs between the stacked lower wiring layer 11 and the upper wiring layer 12 in the manufacturing process, a short circuit defect occurs.

Figure 3:
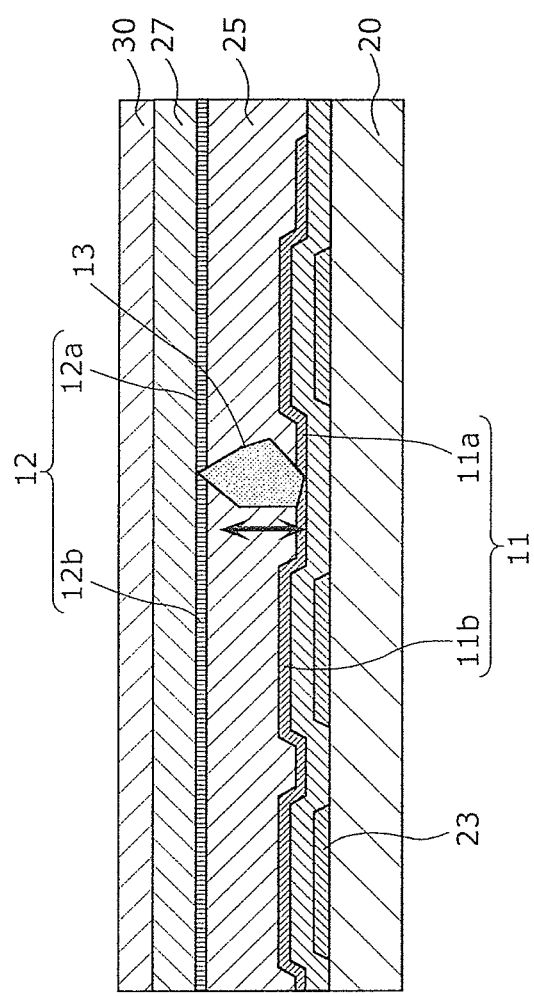
FIG. 3 is a cross-sectional view of the panel periphery of the display device, for describing underlying knowledge forming the basis of the present disclosure.
Figure 4:
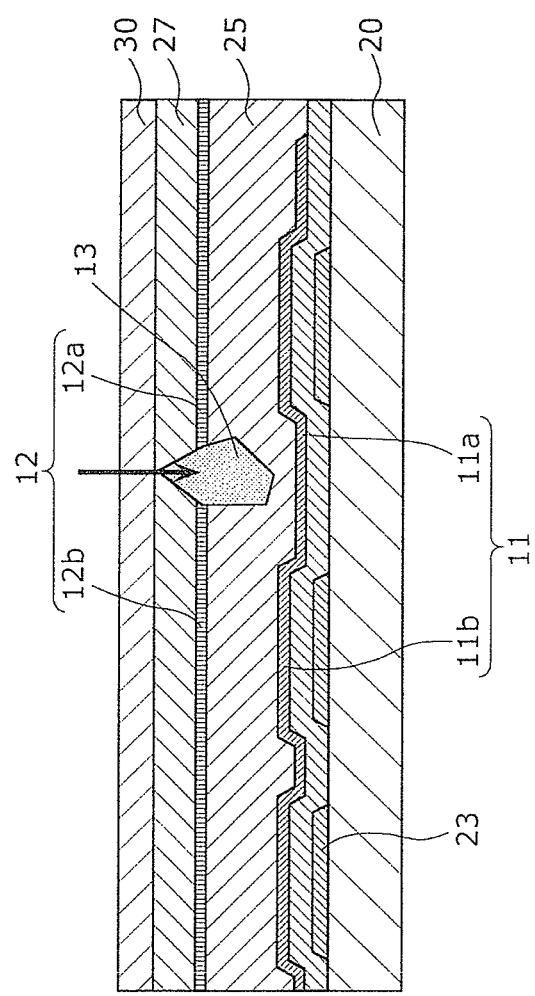
FIG. 4 is a cross-sectional view of the panel periphery of the display device, for describing underlying knowledge forming the basis of the present disclosure.

Specifically, examples of the occurrence of a short circuit defect include the states described below. FIG. 3 and FIG. 4 are cross-sectional views of the panel periphery 3 of the display panel. Furthermore, FIG. 5 is a cross-sectional view of the display area 2 of the display device.

As illustrated in FIG. 3, the panel periphery 3 of the display device 1 has a structure in which a gate insulating layer 22, a gate metal 23, a passivation film 24, the lower wiring layer 11, an interlayer insulating layer 25, and the upper wiring layer 12 are stacked above a substrate 20. Furthermore, an interlayer insulating layer 27 and a glass substrate 30 are provided above the upper wiring layer 12.

Figure 5:
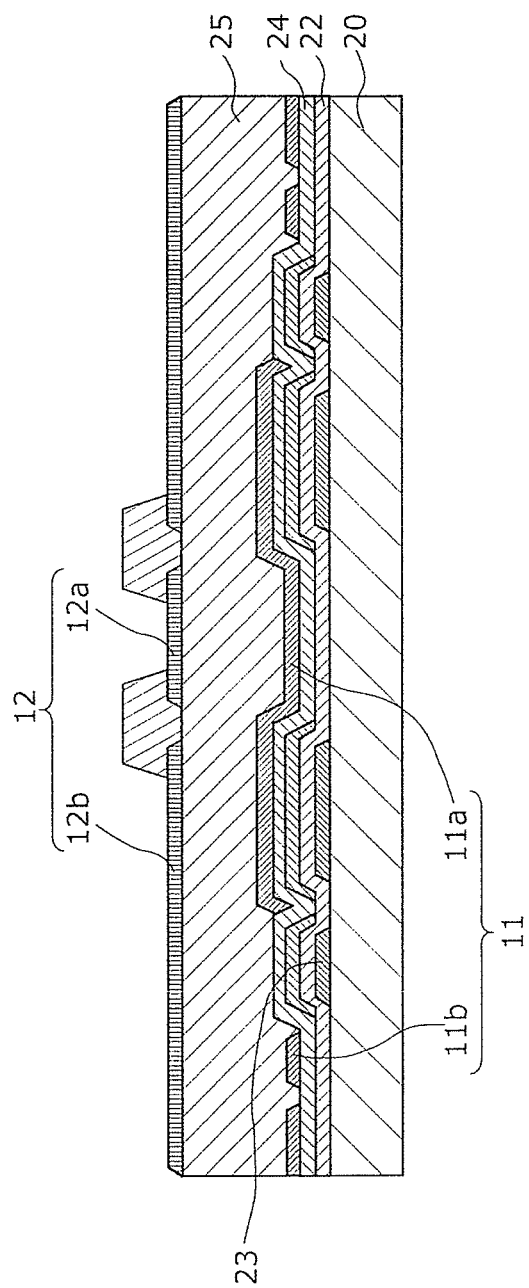
FIG. 5 is a cross-sectional view of a display area of the display device, for describing underlying knowledge forming the basis of the present disclosure.

Furthermore, a cross-sectional view of the display area 2 is illustrated in FIG. 5. The display area 2 of the display device 1 has a structure in which the gate metal 23, the gate insulating layer 22, a channel layer, the passivation film 24, the lower wiring layer 11, the interlayer insulating layer 25, and the upper wiring layer 12 are stacked above the substrate 20. An interlayer insulating layer different from the interlayer insulating layer 27 is further provided above the upper wiring layer 12. A first power supply line 11a and a source/drain electrode (SD) 11b of a transistor may be formed in the same layer in the lower wiring layer 11, and a second power supply line 12a and an anode electrode (AM) 12b may be formed in the same layer in the upper wiring layer 12. It is to be noted that the first power supply line 11a is, for example, a power supply line that supplies power supply voltage to the transistor; the second power supply line 12a is, for example, a power supply line that supplies a voltage different from the voltage supplied by the first power supply line 11a to an organic EL element.

Here, in the process of manufacturing this stacked structure, there are cases where a conductive foreign object 13 mixes in between the lower wiring layer 11 and the upper wiring layer 12. In this case, if the lower wiring layer 11 and the upper wiring layer 12 are electrically connected by the foreign object 13, a short circuit defect occurs in this portion, and deterioration of display quality, such as deterioration of display brightness uniformity, occurs. In particular, when the first power supply line 11a and the second power supply line 12a are short-circuited by the conductive foreign object 13, large current flows and the display device 1 may be destroyed.

Furthermore, as illustrated in FIG. 4, even if the lower wiring layer 11 and the upper wiring layer 12 are not electrically connected by the foreign object 13, in the case where the interlayer insulating layer 27 and the glass substrate 30 are provided above the upper wiring layer 12, there are instances where the foreign object 13 is pressed hard against the power supply lines due to application of pressure to the glass substrate 30 during the bonding process for the glass substrate 30. In this case, the lower wiring layer 11 and the upper wiring layer 12 are electrically connected by the foreign object 13, and a short circuit defect occurs.

Here, as a method of resolving the short circuit defect between the lower wiring layer 11 and the upper wiring layer 12, laser repair is conventionally performed so that the portion at which the short circuit defect occurs is irradiated with a laser to cut-off the portion from other portions and allow the portions without out the short circuit defect to be used. Here, when the three-dimensional crossing point between the lower wiring layer 11 and the upper wiring layer 12 is irradiated with a laser beam, depending on the irradiation condition of the laser beam, the lower wiring layer 11 and the upper wiring layer 12 become connected and the short circuit defect advances further.

Figure 11:
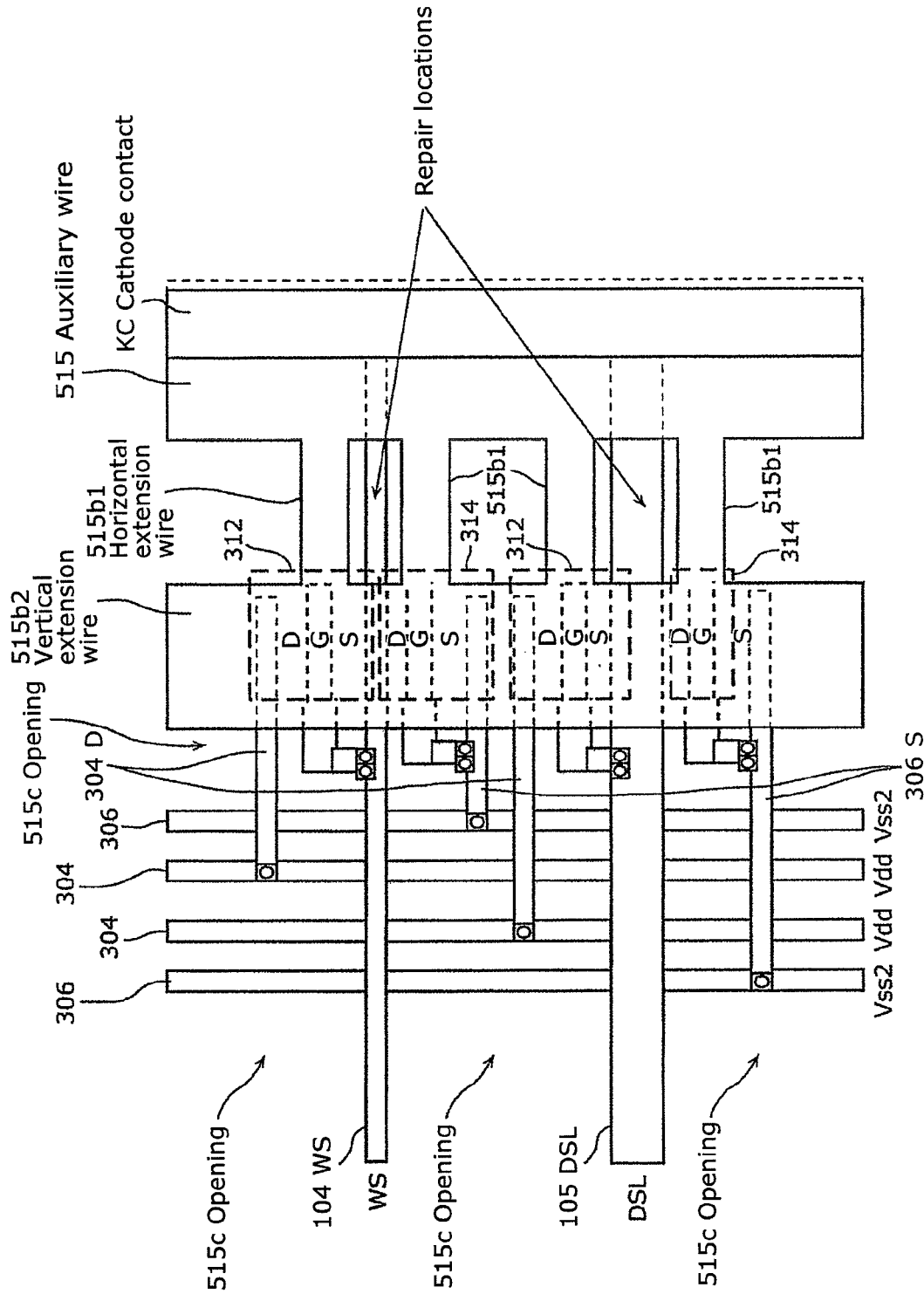
FIG. 11 is a plan perspective view for describing a wiring structure at a vicinity of a thin-film transistor of a protection circuit of a display device in a conventional technique.

In view of this, conventionally, a method has been presented which is capable of resolving (repairing) a short circuit defect by providing, at the three-dimensional crossing point between a lower wiring layer and an upper wiring layer which have different potentials, an opening in one of the wires, and cutting the other wire by laser irradiation, or the like, via the opening, as illustrated in FIG. 11.

FIG. 11 is a plan perspective view for describing a wiring structure at a vicinity of a thin-film transistor of a protection circuit of a display device according to a conventional technique.

As illustrated in FIG. 11, PTL 1 discloses a structure capable of resolving an interwire short circuit by providing, at a three-dimensional crossing point between an auxiliary wire and a signal wire such as DSL or WS having a different potential from the auxiliary wire, an opening in one of the wires and cutting the other wire, via the opening, by laser irradiation, or the like.

However, since the area of the three-dimensional crossing point becomes wide when the lower wiring layer 11 and the upper wiring layer 12, which have different potentials, are both wide, the size of an opening 14 needs to be large as illustrated in FIG. 2. In this case, wiring resistance increases in the wire in which the opening 14 is provided, and thus, if the wire in which the opening 14 is provided is a power supply line for example, deterioration of display quality such as deterioration of display brightness uniformity occurs. As such, a structure that suppresses an increase in wiring resistance even when wide wires three-dimensionally cross each other is required.

The present disclosure provides a display device and a method of manufacturing the display device, such as those described hereafter, which are capable of resolving a short circuit defect while suppressing an increase in wiring resistance.

Although the display device and the method of manufacturing the display device according to the present disclosure are discussed hereafter based on exemplary embodiments, the present disclosure is defined based on the recitations of the Claims. Therefore, among the structural elements in the following exemplary embodiments, structural elements not recited in any one of the claims are not necessarily required to achieve the object of the present disclosure, but are described as structural elements of a more preferable embodiment. Moreover, the respective figures are schematic and are not necessarily exact illustrations.

Embodiment 1

Hereinafter, a display device according to Embodiment 1 is described using FIG. 6 to FIG. 8.

[1-1. Structure of Display Device]

Figure 6:
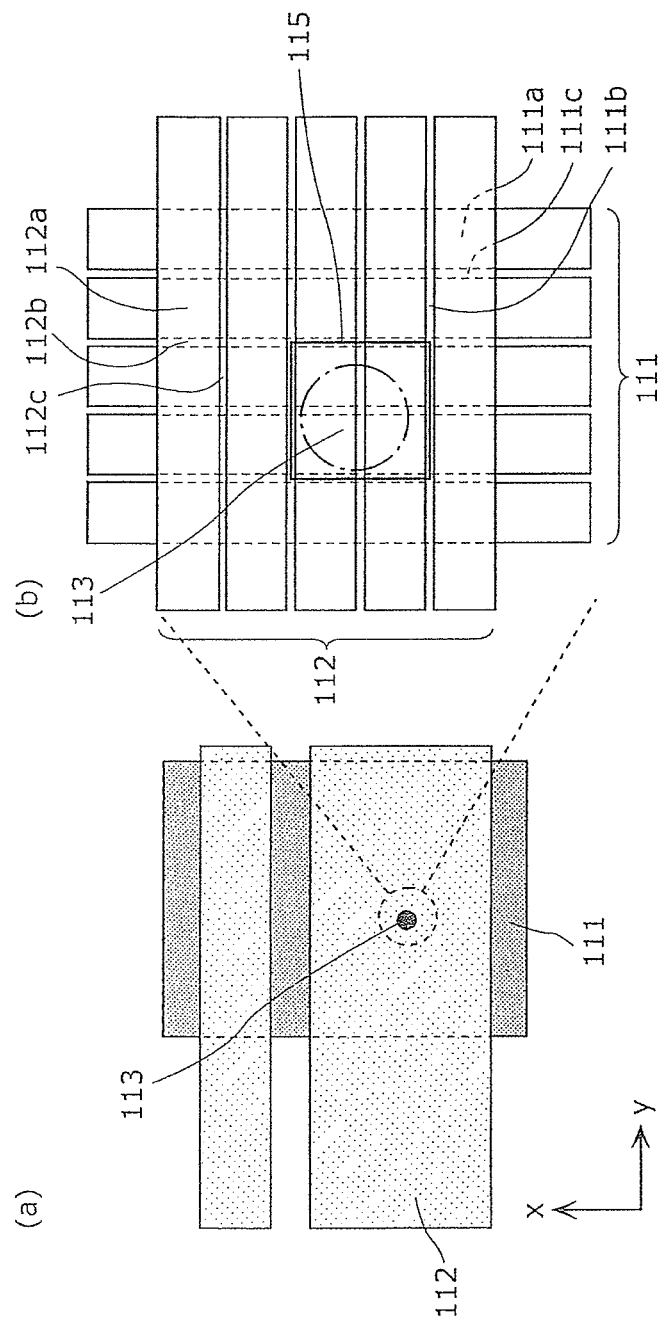
FIG. 6 is top view of a panel periphery of a display device according to Embodiment 1, where (b) illustrates a portion at which wide wires three-dimensionally cross each other, and (a) is an enlarged view of a portion of (b).

FIG. 6 is top view of a panel periphery of the display device 1 according to this embodiment; (b) illustrates a portion at which wide wires three-dimensionally cross each other, and (a) is an enlarged view of a portion of (b). FIG. 7 is a top view of a panel periphery of a display device according to the present embodiment.

As in the display device 1 illustrated in (a) in FIG. 1, the display device 1 according to the present embodiment includes the display area 2 and the panel periphery 3. Pixels each including, for example, a display element such as an organic EL element and a pixel circuit such as a drive transistor are arranged in a matrix in the display area 2. Furthermore, as in the display device illustrated in (b) in FIG. 1, the lower wiring layer 11 and the upper wiring layer 12 are arranged in the panel periphery 3. For example, the first power supply line 11a and the source/drain electrode 11b of a drive circuit layer are formed in the same layer in the lower wiring layer 11. Furthermore, the anode electrode 12b for supplying voltage to an organic EL element is formed in the same layer in the upper wiring layer 12.

As illustrated in (a) in FIG. 6, a first power supply line 111 and a second power supply line 112 in the panel periphery 3 are stacked in such a way that the second power supply line 112 three-dimensionally crosses above the first power supply line 111 via an interlayer insulating layer (not illustrated). In other words, the second power supply line 112 is formed above the first power supply line 111, to extend in a direction (y direction in FIG. 6) that crosses the direction (x direction in FIG. 6) in which the first power supply line 111 extends. Here, the first power supply line 111 and the second power supply line 112 correspond, respectively, to a first electrode and a second electrode in this embodiment.

Specifically, as shown in (b) in FIG. 6, the first power supply line 111 includes a plurality of first partial electrode portions 111a, a plurality of first cuttable portions 111b that are cuttable by irradiation with a laser beam, and a plurality of slit-like first openings 111c. The first partial electrode portions 111a are connected, via the first cuttable portions 111b, so as to be continuous in a first direction. Furthermore, the first openings 111c are connected, via the first partial electrode portions 111a or the first cuttable portions 111b, so as to be continuous in a second direction different from the first direction. First, the first openings 111c are set to a size that allows passage of a laser beam for repairing. For example, although the size (width) of the first openings 111c may be set arbitrarily according to the laser irradiation width, approximately 20 μm to 100 μm is sufficient.

In the same manner, as shown in (b) in FIG. 6, the second power supply line 112 includes a plurality of second partial electrode portions 112a, a plurality of second cuttable portions 112 that are cuttable by irradiation with a laser beam, and a plurality of slit-like second openings 112c. The second partial electrode portions 112a are connected, via the first cuttable portions 112b, so as to be continuous in the second direction different from the first direction. Furthermore, the second openings 112c are connected, via the second partial electrode portions 112a or the second cuttable portions 112b, so as to be continuous in the first direction. First, the second openings 112c are set to a size that allows passage of the laser beam for repairing. For example, although the size (width) of the second openings 112c may be set arbitrarily according to the laser irradiation width, approximately 20 μm to 100 μm is sufficient.

Therefore, in the stacking direction, a first partial electrode portion 111a and a second partial electrode portion 112a overlap, a first cuttable portion 111b and a part of a second opening 112c overlap, and a second cuttable portion 112b and a part of a first opening 111c overlap. With this structure, when viewed from the top, each of the first partial electrode portions 111a is an area surrounded by first cuttable portions 111b and first openings 111c or by second cuttable portions 112b and second openings 112c. In the same manner, each of the second partial electrode portions 112a is an area surrounded by first cuttable portions 111b and first openings 111c or by second cuttable portions 112b and second openings 112c.

Furthermore, the first partial electrode portions 111a and the first cuttable portions 111b are set to a first potential, and the second partial electrode portions 112a and the second cuttable portions 112b are set to a second potential. For example, the first potential is a high-side potential applied to a pixel circuit provided in the display area 2, and the second potential is a low-side potential applied to the pixel circuit.

Here, as indicated by an area 115 in (a) and (b) in FIG. 6, when a conductive foreign object 113 mixes in between the first power supply line 111 and the second power supply line 112, the first power supply line 111 and the second power supply line 112 become electrically connected and a short circuit defect occurs. In order to resolve the short circuit defect, cutting out part of the first power supply line 111 and second power supply line 112 by irradiation with a laser beam so as to surround the foreign object 113.

Specifically, as illustrated in (b) in FIG. 6, laser beam irradiation is performed on the first power supply line 111 and the second power supply line 112 to surround an area (repair area) 115 in which the foreign object 113 is formed. Accordingly, by making cuts in the first power supply line 111 and the second power supply line 112, the first power supply line 111 and the second power supply line 112 in the repair area 115 in which the foreign object 113 is formed are electrically cut off from other areas.

The laser beam irradiation is performed, for example, in an order starting from a first cuttable portion 111b, then to the overlapping portions of a first opening 111c and a second opening 112c, then to a second cuttable portion 112b, then to the overlapping portions of a first opening 111c and a second opening 112c, then to a first cuttable portion 111b, and so on.

If the foreign object 113 is of a large size and the area of the area 115 needs to be made large, the laser beam irradiation from a first cuttable portion 111b to the overlapping portions of a first opening 111c and a second opening 112c is sequentially performed on multiple first cuttable portions 111b and overlapping portions of multiple first openings 111c and second openings 112c, after which the laser beam irradiation from a second cuttable portion 112b to the overlapping portions of a first opening 111c and a second opening 112c is sequentially performed on multiple second cuttable portions 112b and overlapping portions of multiple second openings 112c and first openings 111c.

The reason for setting the laser beam irradiation positions to a first cuttable portion 111b, the overlapping portions of a first opening 111c and a second opening 112c, and a second cuttable portion 112b is that, since the first power supply line 111 (first partial electrode portion 111a) and the second power supply line 112 (second partial electrode 112a) overlap in the first partial electrode portions 111a and the second partial electrode portions 112a, it is possible that the first power supply line 111 (first partial electrode portion 111a) and the second power supply line 112 (second partial electrode 112a) which have different potentials may become connected if irradiated with the laser beam.

By performing laser beam irradiation on the first cuttable portions 111b and the second cuttable portions 112b in which the first power supply line 111 and the second power supply line 112 do not overlap, the first power supply line 111 and the second power supply line 112 do not become connected even if the laser beam is continuously irradiated to surround the position at which the foreign object 113 is formed and where the short circuit defect is occurring. Therefore, it is possible to electrically cut-off the first power supply line 111 and the second power supply line 112 at the position at which the foreign object 113 is formed, and thus resolve the short circuit defect. Furthermore, since the area to be irradiated with the laser beam can be any area as long as it is on the first cuttable portions 111b, the first openings 111c and the second openings 112c, and the second cuttable portions 112b, the size of the area to be cut off can be changed by irradiating the laser beam in accordance with the size of the foreign object 113. Furthermore, although description is made with the laser beam being irradiated from a direction in which the second power supply line 112 is seen on top, the same is true even when the laser beam is irradiated from the opposite side of the substrate, that is, from the direction in which the first power supply line 111 is seen on top.

Figure 7:
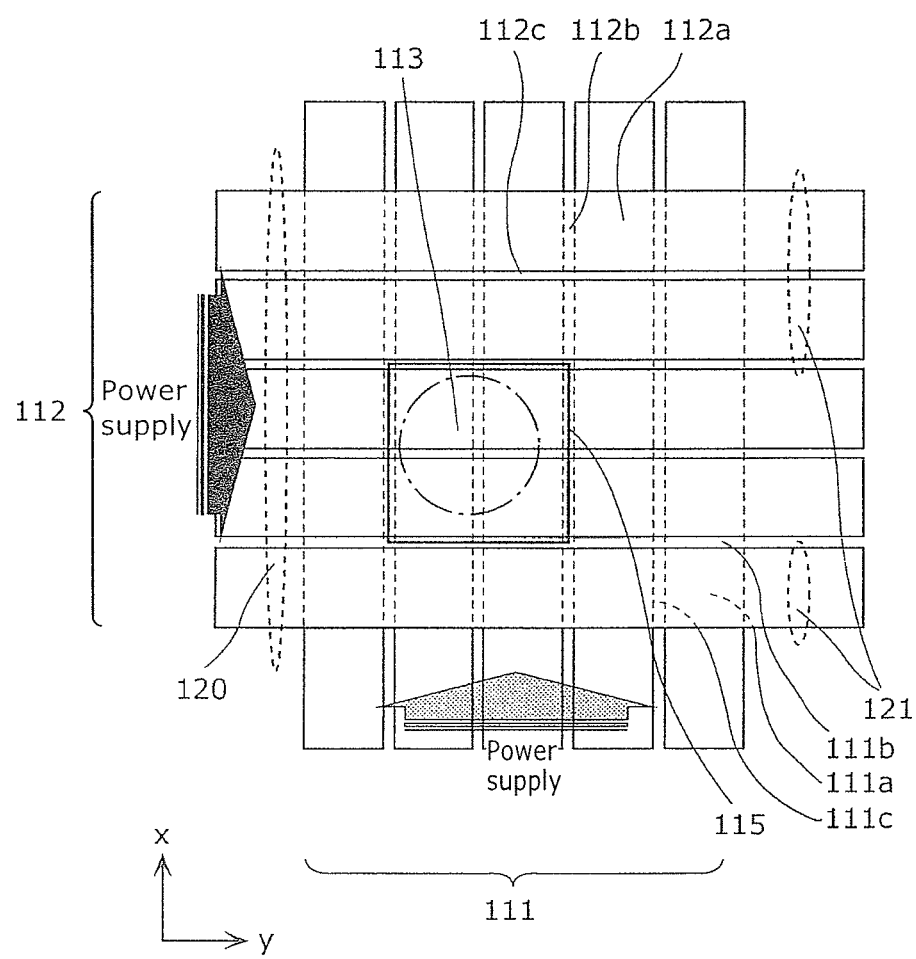
FIG. 7 is a top view of a panel periphery of a display device after a short circuit defect is resolved by laser irradiation.

FIG. 7 is a top view of the panel periphery 3 of the display device 1 after the short circuit defect is resolved by laser beam irradiation. When the short circuit defect is resolved by laser beam irradiation, voltage is supplied to all of the second partial electrode portions 112a indicated by area 120 in the second power supply line 112, as illustrated in FIG. 7. On the other hand, since the repair area 115 after the short circuit defect is resolved is electrically cut off from the rest of the areas of the second power supply line 112, the voltage provided from the power supplying side cannot be provided to the side opposite the power supplying side with respect to the repair area 115. Therefore, the voltage is supplied only to the second partial electrode portions 112a indicated by area 121. In other words, the second power supply line 112 in an area that has been electrically cut off by laser beam irradiation becomes unusable.

Likewise, in the first power supply line 111, the first power supply line 111 in an area that has been electrically cut off by laser beam irradiation becomes unusable.

[1-2. Method of Manufacturing the Display Device]

Next, a method of manufacturing the display device according to this embodiment is described.

Figure 8:
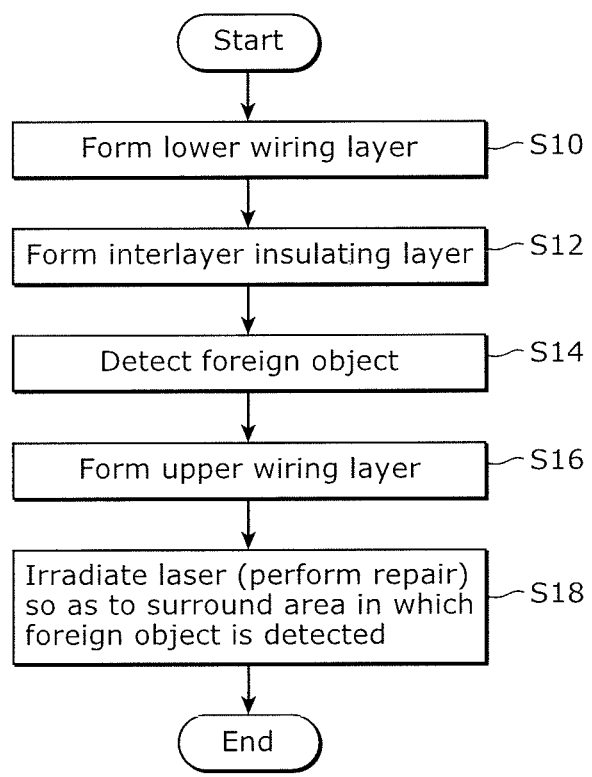
FIG. 8 is a flowchart illustrating a manufacturing process for the display device according to Embodiment 1.

FIG. 8 illustrates an outline of a process in the method of manufacturing the display device 1 according to this embodiment. The display device 1 according to this embodiment is manufactured in the manner described below.

As indicated in FIG. 8, first, a lower wiring layer including the first power supply line 111 is formed above a substrate (step S10). Furthermore, as the lower wiring layer including the first power supply line 111, other wires may be simultaneously formed. For example, a source/drain electrode of a transistor may be formed in the same layer as the first power supply line 111. Furthermore, as illustrated in FIG. 3, the gate metal 23 of a transistor may be formed on the substrate 20 before the forming of the source/drain electrode. The forming of the lower wiring layer is performed, for example, by forming a metal film of Al or the like above the substrate 20 and then performing patterning by photolithography and wet etching.

Next, an interlayer insulating layer is formed above the lower wiring layer (step S12). The interlayer insulating layer 25 is, for example, formed from an insulating organic material, or the like.

Next, detection of a short circuit position is performed. Specifically, a foreign object that has mixed in above the first power supply line 111 is detected (step S14). Here, the foreign object 113 corresponds to, for example, a particle, or the like, present in an apparatus or transfer system used during the process of forming the lower wiring layer and the interlayer insulating layer. In the detection of a foreign object, detection is performed, for example, by capturing images of a foreign object detection target area using a camera.

Next, an upper wiring layer including the second power supply line 112 is formed above the interlayer insulating layer (step S16). The forming of the upper wiring layer is performed, for example, by forming a metal layer of Al or the like on the interlayer insulating layer (planarizing film) and then performing patterning by photolithography and wet etching.

Next, the first power supply line 111 and the second power supply line 112 are irradiated with a laser beam to surround the area in which the foreign object 113 has mixed in (step S18). The laser beam irradiation is performed in an order starting from a cuttable portion 111b, then to the overlapping portions of a first opening 111c and a second opening 112c, then to a second cuttable portion 112b, then to the overlapping portions of a first opening 111c and a second opening 112c, then to a first cuttable portion 111b, and so on. The type of the laser beam may be, for example, a short-pulse laser, a femtosecond laser, or the like. With this, in each of the first power supply line 111 and the second power supply line 112, the area to which the conductive foreign object 113 has mixed in is cut off from the other areas, and the short circuit defect is resolved.

It is to be noted that the process of detecting a foreign object that has mixed in above the first electrode may be performed after the second electrode is formed.

As described above, according to the display device and the method of manufacturing the display device according to this embodiment, each of the first electrode and the second electrode include a plurality of first openings and a plurality of second openings, respectively, and it is sufficient that the first openings and the second openings are of a size that allows passage of the laser beam. Therefore, there is no need to provide openings having large areas in the first electrode and the second electrode, and thus a short circuit defect can be resolved while suppressing an increase in wiring resistance.

[1-3. Advantageous Effects, Etc.]

As described above, a display device according to an aspect of the present embodiment includes: a first electrode set to a first potential; an interlayer insulating layer stacked above the first electrode; a second electrode stacked above the interlayer insulating layer and set to a second potential different from the first potential; and a display area including a pixel electrode, wherein the first electrode includes: a plurality of first partial electrode portions; a plurality of first cuttable portions that are cuttable by irradiation with a laser beam; and a plurality of first openings, the second electrode includes: a plurality of second partial electrode portions; a plurality of second cuttable portions that are cuttable by irradiation with the laser beam; and a plurality of second openings, the first partial electrode portions and the second partial electrode portions are disposed in overlapping positions in a stacking direction via the interlayer insulating layer, the first cuttable portions and the second openings are disposed in overlapping positions in the stacking direction via the interlayer insulating layer, the second cuttable portions and the first openings are disposed in overlapping positions in the stacking direction via the interlayer insulating layer, and the first potential is a high-side potential applied to a pixel circuit provided in the display area, and the second potential is a low-side potential applied to the pixel circuit.

Accordingly, since the size of the openings for laser beam irradiation that are formed in the electrodes need not be made large, a short circuit defect can be resolved and wiring resistance can be reduced.

Furthermore, even if a foreign object is formed in a part where the first electrode and the second electrode overlap, the short circuit defect can be resolved by irradiating the laser beam to surround the area in which the foreign object is formed.

Furthermore, one of the first partial electrode portions and another of the first partial electrode portions may be continuously connected in a first direction via one of the first cuttable portions, one of the second partial electrode portions and another of the second partial electrode portions may be continuously connected in a second direction different from the first direction via one of the second cuttable portions, each of the first openings may be formed in a slit shape extending in the first direction, and each of the second openings may be formed in a slit shape extending in the second direction.

Furthermore, one of the first partial electrode portions and another of the first partial electrode portions may be continuously connected in a first direction via one of the first cuttable portions, one of the second partial electrode portions and another of the second partial electrode portions may be continuously connected in a second direction different from the first direction via one of the second cuttable portions, the first electrode may further include a plurality of first connecting electrode portions each of which continuously connects one of the first cuttable portions and another of the first cuttable portions in the second direction, the second electrode may further include a plurality of second connecting electrode portions each of which continuously connects one of the second cuttable portions and another of the second cuttable portions in the first direction, and the first connecting electrode portions and the second connecting electrode portions may be disposed in overlapping positions in the stacking direction via the interlayer insulating layer.

Accordingly, the short circuit defect can be resolved while suppressing an increase in wiring resistance. Furthermore, even after laser beam irradiation for resolving a short circuit defect is performed on the first electrode and the second electrode, voltage can be supplied to all areas of the first electrode and the second electrode.

Furthermore, the first openings and the second openings are larger in size than a diameter of the laser beam.

Accordingly, a second cuttable portion can be irradiated with the laser beam via a first opening. In the same manner, a first cuttable portion can be irradiated with the laser beam via a second opening.

Furthermore, the display device may include a drive circuit layer including a thin-film transistor, wherein one of the first electrode and the second electrode may be formed in a same layer as one of a gate electrode and a source/drain electrode of the thin-film transistor in the drive circuit layer, and an other of the first electrode and the second electrode may be formed in a same layer as the pixel electrode in the display area.

Furthermore, a method of manufacturing a display device according to an aspect of the present embodiment includes: forming a first electrode set to a first potential; forming an interlayer insulating layer above the first electrode; forming a second electrode above the interlayer insulating layer, the second electrode being set to a second potential different from the first potential; detecting a short circuit position at which the first electrode and the second electrode are short-circuited; and irradiating the first electrode and the second electrode with a laser beam to surround the short circuit position, wherein in the forming of a first electrode, a plurality of first partial electrode portions, a plurality of first cuttable portions that are cuttable by irradiation with the laser beam, and a plurality of first openings are formed, in the forming of a second electrode, a plurality of second partial electrode portions, a plurality of second cuttable portions that are cuttable by irradiation with the laser beam, and a plurality of second openings are formed, the first cuttable portions and the second openings are disposed in overlapping positions in a stacking direction via the interlayer insulating layer, the second cuttable portions and the first openings are disposed in overlapping positions in the stacking direction via the interlayer insulating layer, and in the irradiating, at least one each of the first cuttable portions and the second cuttable portions are irradiated with the laser beam, and the first potential is a high-side potential applied to a pixel circuit provided in a display area included in the display device, and the second potential is a low-side potential applied to the pixel circuit.

Accordingly, since the size of the openings for laser beam irradiation that are formed in the electrodes need not be made large, the short circuit defect can be resolved and an increase in wiring resistance accompanying the placement of an opening can be effectively suppressed.

Furthermore, even if a foreign object is formed in a part where the first electrode and the second electrode overlap, the short circuit defect can be resolved by irradiating the laser beam to surround the area in which the foreign object is formed.

Furthermore, the detecting of a short circuit position is performed after the forming of a second electrode.

Accordingly, it is possible to detect the short circuit position in the case where a short circuit occurs due to direct contact between the first electrode and the second electrode.

Furthermore, the pixel circuit may include a drive transistor and an organic EL element, the first potential may be applied to one of the drive transistor and the organic EL element, and the second potential may be applied to an other of the drive transistor and the organic EL element.

Furthermore, a display device according to an aspect of the present embodiment includes: a first electrode set to a first potential; an interlayer insulating layer stacked above the first electrode; and a second electrode stacked above the interlayer insulating layer and set to a second potential different from the first potential, wherein the first electrode includes: a plurality of first partial electrode portions; a plurality of first cuttable portions that are cuttable by irradiation with a laser beam; and a plurality of first openings, the second electrode includes: a plurality of second partial electrode portions; a plurality of second cuttable portions that are cuttable by irradiation with the laser beam; and a plurality of second openings, the first partial electrode portions and the second partial electrode portions are disposed in overlapping positions in a stacking direction via the interlayer insulating layer, the first cuttable portions and the second openings are disposed in overlapping positions in the stacking direction via the interlayer insulating layer, the second cuttable portions and the first openings are disposed in overlapping positions in the stacking direction via the interlayer insulating layer, one of the first partial electrode portions and another of the first partial electrode portions are continuously connected in a first direction via one of the first cuttable portions, one of the second partial electrode portions and another of the second partial electrode portions are continuously connected in a second direction different from the first direction via one of the second cuttable portions, the first electrode further includes a plurality of first connecting electrode portions each of which continuously connects one of the first cuttable portions and another of the first cuttable portions in the second direction, the second electrode further includes a plurality of second connecting electrode portions each of which continuously connects one of the second cuttable portions and another of the second cuttable portions in the first direction, and the first connecting electrode portions and the second connecting electrode portions are disposed in overlapping positions in the stacking direction via the interlayer insulating layer.

Accordingly, since the size of the openings for laser beam irradiation that are formed in the electrodes need not be made large, the short circuit defect can be resolved and an increase in wiring resistance accompanying the placement of an opening can be effectively suppressed.

Furthermore, even if a foreign object is formed in a part where the first electrode and the second electrode overlap, the short circuit defect can be resolved by irradiating the laser beam to surround the area in which the foreign object is formed.

Embodiment 2

Next, Embodiment 2 is described below. A display device according to this embodiment is different from the display device according to Embodiment 1 in terms of the structure of the first electrode and the second electrode. Hereinafter, Embodiment 2 is described using FIG. 9.

[2-1. Structure of Display Device]

Figure 9:
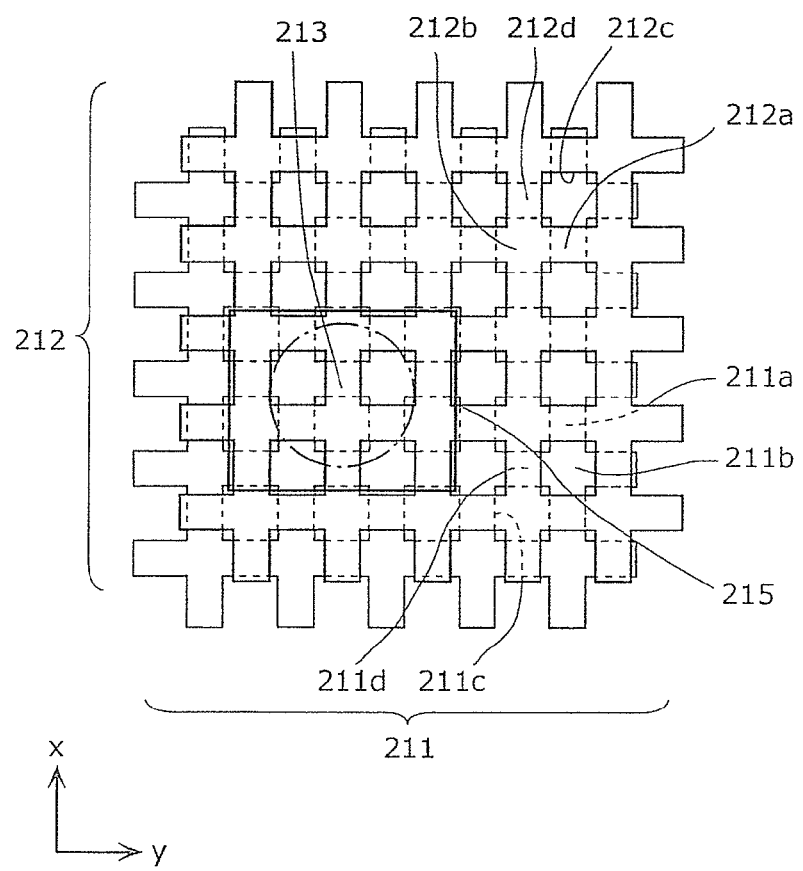
FIG. 9 is a top view of a panel periphery of a display device according to Embodiment 2.

FIG. 9 is a top view of a panel periphery of the display device according to the present embodiment.

As illustrated in FIG. 9, a first power supply line 211 which is the first electrode according to this embodiment includes first partial electrode portions 211a, first cuttable portions 211b, first openings 211c, and first connecting electrode portions 211d. Furthermore, a second power supply line 211 which is the second electrode according to this embodiment includes second partial electrode portion 212a, second cuttable portions 212b, second openings 212c, and second connecting electrode portions 212d. The first connecting electrode portions 211d and the second connecting electrode portions 212d are arranged in overlapping positions in the stacking directions, via an interlayer insulating layer.

[2-2. Method of Manufacturing the Display Device]

Here, a method of manufacturing the display device according to this embodiment is described.

As illustrated in FIG. 9, if a foreign object 231 mixes in between the first power supply line 211 and the second power supply line 212, the first power supply line 211 and the second power supply line 212 become electrically connected, and thus a short circuit defect occurs. In order to resolve the short circuit defect, at least the areas of the first power supply line 211 and the second power supply line 212 in which the short-circuit defect occurs are electrically cut off from other areas by irradiation with a laser beam to surround the periphery of the foreign object 213.

Specifically, as illustrated by a repair area 215 in FIG. 9, irradiation with a laser beam is performed on the first power supply line 111 and the second power supply line 112 to surround an area (repair area) 215 in which the foreign object 213 is formed. Accordingly, by making cuts in the first power supply line 211 and the second power supply line 212, the first power supply line 211 and the second power supply line 212 in the repair area 215 in which the foreign object 213 is formed is electrically cut off from other areas.

The laser beam irradiation is performed in an order starting from a first cuttable portion 211b, then to the overlapping portions of a first opening 211c and a second opening 212c, then to a second connecting electrode portion 212d, then to the overlapping portions of a first opening 211c and a second opening 212c, then to a first cuttable portion 211b, and so on. Alternatively, the laser beam irradiation is performed in an order starting from a second cuttable portion 212b, then to the overlapping positions of a second opening 212c and a first opening 211c, then to a first connecting electrode portion 211d, then to the overlapping positions of a second opening 212c and a first opening 211c, then to a second cuttable portion 212b, and so on.

If the foreign object 113 is of a large size and the area of the area 115 needs to be made large, the laser beam irradiation from a first cuttable portion 211b, then to the overlapping portions of a first opening 211c and a second opening 212c is sequentially performed on multiple first cuttable portions 211b and overlapping portions of multiple first openings 211c and second openings 212c, after which the laser beam irradiation from a second connecting electrode portion 212d to the overlapping portions of a first opening 211c and a second opening 212c is sequentially performed on multiple second connecting electrode portions 212d and overlapping portions of multiple first openings 211c and second openings 212c. Alternatively, the laser beam irradiation from a second cuttable portion 212b to the overlapping positions of a second opening 212c and a first opening 211c is sequentially performed on multiple second cuttable portions 212b and overlapping positions of multiple second openings 212c and first openings 211c, after which the laser beam irradiation from a first connecting electrode portion 211d to the overlapping positions of a second opening 212c and a first opening 211c is sequentially performed on multiple first connecting electrode portions 211d and overlapping positions of multiple second openings 212c and multiple first openings 211c.

The reason for setting the laser irradiation positions to a first cuttable portion 211b, a second cuttable portion 212b, the overlapping portions of a first opening 211c and a second opening 212c, a first connecting electrode portion 211d, and a second connecting electrode portion 212d is that, since the first power supply line 211 (first partial electrode portion 211a) and the second power supply line 212 (second partial electrode portion 212a) overlap in the first partial electrode portions 211a and the second partial electrode portions 212a, and the first connecting electrode portions 211d and the second connecting electrode portions 212d, it is possible that the first power supply line 211 (first partial electrode portion 211a) and the second power supply line 212 (second partial electrode 212a) which have different potentials may become connected if irradiated with the laser beam.

By performing laser beam irradiation on the first cuttable portions 211b and the second cuttable portions 212b in which the first power supply line 211 and the second power supply line 212 do not overlap, the first power supply line 211 and the second power supply line 212 do not become connected even if the laser beam is continuously irradiated to surround the position at which the foreign object 213 is formed and where the short circuit defect is occurring. Therefore, it is possible to electrically cut-off the first power supply line 211 and the second power supply line 212 at the position at which the foreign object 213 is formed, and thus resolve the short circuit defect. Furthermore, since the area around which the laser beam is to be irradiated can be any area as long as it is on the first cuttable portions 211b, the first openings 211c and the second openings 212c, and the second cuttable portions 212b, the size of the area to be cut off can be changed by irradiating the laser beam in accordance with the size of the foreign object 213.

In the display device 1 according to Embodiment 1, the voltage provided from the power supplying side cannot be provided to the side opposite the power supplying side with respect to the repair area 115, and thus the voltage is supplied only to the second partial electrode portions 112a indicated by area 121. Therefore, the second power supply line 112 in an area that has been electrically cut off by the laser beam irradiation becomes unusable. In contrast, in the display device 1 according to this embodiment, the voltage provided from the power supplying side is also provided to the side opposite the power supplying side with respect to the repair area 215, and thus voltage can be provided the first power supply line 211 and the second power supply line 212 outside an area that has been electrically cut off by the laser beam irradiation.

[2-3. Advantageous Effects, Etc.]

As described above, according to the display device and the method of manufacturing the display device according to this embodiment, a short circuit defect can be resolved while suppressing an increase in wiring resistance. Furthermore, even after laser beam irradiation for resolving a short circuit defect is performed on the first power supply line 211 and the second power supply line 212, voltage can be provided to the first power supply line 211 and the second power supply line 212 outside an area that has been electrically cut off.

Other Embodiments

As described above, Embodiments 1 and 2 are described as exemplifications of the technique disclosed in the present application. However, the technique according to the present disclosure is not limited to the foregoing embodiments, and can also be applied to embodiments to which a change, substitution, addition, or omission is executed as necessary. Furthermore, a new embodiment can be formed by combining the respective structural elements described in Embodiments 1 and 2.

In view of this, other embodiments are described collectively below.

Although the first electrode and the second electrode are described as a first power supply line and a second power supply line, respectively, in the foregoing embodiments, the first electrode and the second electrode are not limited to power supply lines, and may be other wires as long as they are wires having different potential. Specifically, the second electrode may be formed as a layer that is different from the anode electrode which supplies voltage to an organic EL element.

Furthermore, although the process of detecting the short circuit position is performed before the process of forming the second electrode in the foregoing embodiments, the process of detecting the short circuit position may be performed after the process of forming the second electrode. Detecting the short circuit position after forming the second electrode is effective, for example, for cases where a pinhole is formed in the position of the short circuited part in the process of forming an interlayer insulating layer and the second electrode, after which the second electrode is formed in the pinhole due to the material of the second electrode flowing into the pinhole, which results in the first electrode and the second electrode coming into direct contact.

Furthermore, although a configuration in which the first power supply line which is the first electrode and the second power supply line which is the second electrode are orthogonal when viewed from above is indicated in the foregoing embodiments, as long as the first electrode and the second electrode cross each other when viewed from above, any crossing angle is acceptable.

Furthermore, although the first power supply line which is the first electrode or the second power supply line which is the second electrode is cut by laser irradiation, laser irradiation may increase the resistance of the first electrode and the second electrode.

Furthermore, the laser beam irradiation may be performed on any area as long as it cuts off a first cuttable portion and a second cuttable portion.

Furthermore, the shape of the first openings and the second openings is not limited to the above-described shape, and may be another shape such as circular, and so on.

Furthermore, although a display device for use in an organic EL display device, and so on, is described in the forgoing embodiments, the display device can also be applied to a liquid-crystal electronic device or the like, another display device in which an active-matrix substrate is used, a display panel, a mother board of a panel for a mobile terminal, and so on. In particular, an electronic device having the above configuration can be used as a flat panel display, and can be applied to every electronic device having a display panel, such as a television set, a personal computer, and a cellular phone.

Figure 10:
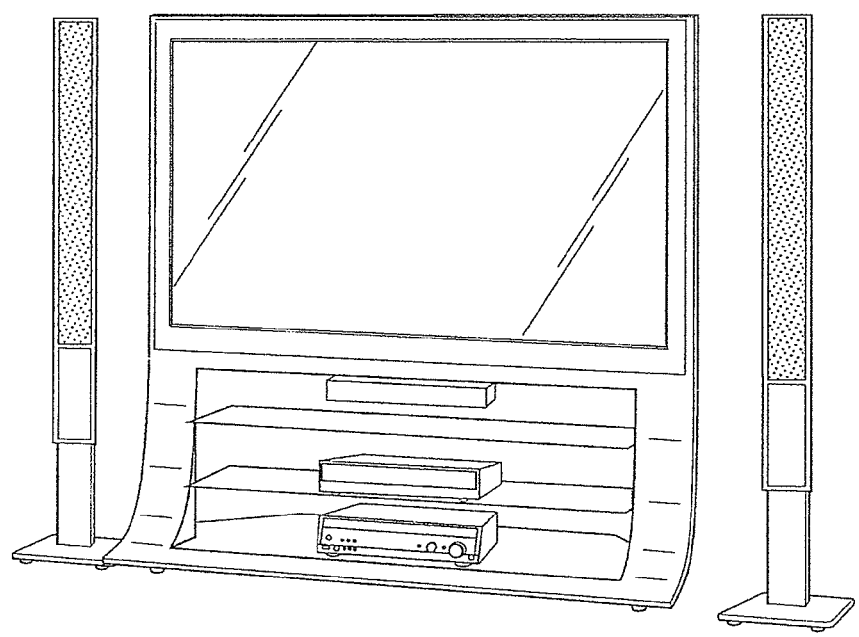
FIG. 10 is diagram illustrating an outward appearance of a television system including an organic EL element.

Furthermore, for example, a display device according to the present disclosure is built into a thin flat-screen TV such as that illustrated in FIG. 10. A thin flat-screen TV capable of precise image display reflecting a video signal is implemented by having the display device according to the present disclosure built into the TV.

Moreover, embodiments obtained through various modifications to the respective exemplary embodiments which may be conceived by a person skilled in the art as well as embodiments realized by arbitrarily combining the structural elements and functions of the respective exemplary embodiments without materially departing from the spirit of the present disclosure are included in the present disclosure.

As described above, exemplary embodiments are described as exemplifications of the technique according to the present disclosure. The accompanying drawings and detailed description are provided for this purpose.

Therefore, the structural elements described in the accompanying drawings and detailed description include, not only structural elements essential to solving the problem, but also structural elements that are not essential to solving the problem but are included in order to exemplify the aforementioned technique. As such, description of these non-essential structural elements in the accompanying drawings and the detailed description should not be taken to mean that these non-essential structural elements are essential.

Furthermore, since the foregoing embodiments are for exemplifying the technique according to the present disclosure, various changes, substitutions, additions, omissions, and so on, can be carried out within the scope of the Claims or its equivalents.

INDUSTRIAL APPLICABILITY

The present disclosure can be applied to a display device which includes a lower wiring layer and an upper wiring layer, and in which there is a possibility of the occurrence of a short circuit defect. Specifically, the present disclosure can be widely used in a thin-screen television, a personal computer, a mobile display device such as a cellular phone, and so on.

REFERENCE SIGNS LIST 1 display device
2 display area
3 panel periphery
11, lower wiring layer
11a, 111, 211 first power supply line (first electrode)
11b source/drain electrode
12, upper wiring layer
12a, 112, 212 second power supply line (second electrode)
12b anode electrode
13, 113, 213 foreign object
14 opening
20 substrate
22 gate insulating layer
23 gate metal
24 passivation film
25 interlayer insulating layer
111a, 211 a first partial electrode portion
111b, 211b first cuttable portion
111c, 211c first opening
112a, 212a second partial electrode portion
112b, 212b second cuttable portion
112c, 212c second opening
115, 215 repair area
211d first connecting electrode portion
212d second connecting electrode portion

The invention claimed is:

1. A display device, comprising:
a first electrode set to a first potential;
an interlayer insulating layer stacked above the first electrode;
a second electrode stacked above the interlayer insulating layer and set to a second potential different from the first potential; and
a display area including a pixel electrode,
wherein the first electrode includes:
a plurality of first partial electrode portions;
a plurality of first cuttable portions that are cuttable by irradiation with a laser beam; and
a plurality of first openings,
the second electrode includes:
a plurality of second partial electrode portions;
a plurality of second cuttable portions that are cuttable by irradiation with the laser beam; and
a plurality of second openings,
the first partial electrode portions and the second partial electrode portions are disposed in overlapping positions in a stacking direction via the interlayer insulating layer,
the first cuttable portions and the second openings are disposed in overlapping positions in the stacking direction via the interlayer insulating layer,
the second cuttable portions and the first openings are disposed in overlapping positions in the stacking direction via the interlayer insulating layer,
each of the first openings is formed in a slit shape extending in a first direction and overlapping at least two of the second partial electrode portions, each of the first cuttable portions extending transversely to and between at least two of the first openings,
each of the second openings is formed in a slit shape extending in a second direction different than the first direction and overlapping at least two of the first partial electrode portions, each of the second cuttable portions extending transversely to and between at least two of the second openings, and
the first potential is a high-side potential applied to a pixel circuit provided in the display area, and the second potential is a low-side potential applied to the pixel circuit.

2. The display device according to claim 1,
wherein one of the first partial electrode portions and another of the first partial electrode portions are continuously connected in the first direction via one of the first cuttable portions, and
one of the second partial electrode portions and another of the second partial electrode portions are continuously connected in the second direction different from the first direction via one of the second cuttable portions.

3. The display device according to claim 1,
wherein the first openings and the second openings are larger in size than a diameter of the laser beam.

4. The display device according to claim 1, comprising:
a drive circuit layer including a thin-film transistor;
wherein one of the first electrode and the second electrode is formed in a same layer as one of a gate electrode and a source/drain electrode of the thin-film transistor in the drive circuit layer, and
an other of the first electrode and the second electrode is formed in a same layer as the pixel electrode in the display area.

5. The display device according to claim 1,
wherein the pixel circuit includes a drive transistor and an organic EL element,
the first potential is applied to one of the drive transistor and the organic EL element, and
the second potential is applied to an other of the drive transistor and the organic EL element.

6. A method of manufacturing a display device, the method comprising:
forming a first electrode set to a first potential;
forming an interlayer insulating layer above the first electrode;
forming a second electrode above the interlayer insulating layer, the second electrode being set to a second potential different from the first potential;

detecting a short circuit position at which the first electrode and the second electrode are short-circuited; and irradiating the first electrode and the second electrode with a laser beam to surround the short circuit position, wherein in the forming of a first electrode, a plurality of first partial electrode portions, a plurality of first cuttable portions that are cuttable by irradiation with the laser beam, and a plurality of first openings are formed, in the forming of a second electrode, a plurality of second partial electrode portions, a plurality of second cuttable portions that are cuttable by irradiation with the laser beam, and a plurality of second openings are formed, the first cuttable portions and the second openings are disposed in overlapping positions in a stacking direction via the interlayer insulating layer, the second cuttable portions and the first openings are disposed in overlapping positions in the stacking direction via the interlayer insulating layer, each of the first openings is formed in a slit shape extending in a first direction and overlapping at least two of the second partial electrode portions, each of the first cuttable portions extending transversely to and between at least two of the first openings, each of the second openings is formed in a slit shape extending in a second direction different than the first direction and overlapping at least two of the first partial electrode portions, each of the second cuttable portions extending transversely to and between at least two of the second openings, and in the irradiating, at least one each of the first cuttable portions and the second cuttable portions is irradiated with the laser beam, and the first potential is a high-side potential applied to a pixel circuit provided in a display area included in the display device, and the second potential is a low-side potential applied to the pixel circuit.

7. The method of manufacturing a display device according to claim 6, wherein the detecting of a short circuit position is performed after the forming of a second electrode.

8. A display device comprising:

a first electrode set to a first potential;

an interlayer insulating layer stacked above the first electrode; and a second electrode stacked above the interlayer insulating layer and set to a second potential different from the first potential, wherein the first electrode includes:
a plurality of first partial electrode portions;
a plurality of first cuttable portions that are cuttable by irradiation with a laser beam; and
a plurality of first openings, the second electrode includes:
a plurality of second partial electrode portions;
a plurality of second cuttable portions that are cuttable by irradiation with the laser beam; and
a plurality of second openings, the first partial electrode portions and the second partial electrode portions are disposed in overlapping positions in a stacking direction via the interlayer insulating layer, the first cuttable portions and the second openings are disposed in overlapping positions in the stacking direction via the interlayer insulating layer, the second cuttable portions and the first openings are disposed in overlapping positions in the stacking direction via the interlayer insulating layer, one of the first partial electrode portions and another of the first partial electrode portions are continuously connected in a first direction via one of the first cuttable portions, the first partial electrode portions and the first cuttable portions defining columns of the first electrode extending in the first direction, one of the second partial electrode portions and another of the second partial electrode portions are continuously connected in a second direction different from the first direction via one of the second cuttable portions, the second partial electrode portions and the second cuttable portions defining rows of the second electrode extending in the second direction, the first electrode further includes a plurality of first connecting electrode portions each of which continuously connects one of the first cuttable portions and another of the first cuttable portions in the second direction, the first connecting electrode portions and the first cuttable portions defining rows of the first electrode extending in the second direction, the second electrode further includes a plurality of second connecting electrode portions each of which continuously connects one of the second cuttable portions and another of the second cuttable portions in the first direction, the second connecting electrode portions and the second cuttable portions defining columns of the second electrode extending in the first direction, and the first connecting electrode portions and the second connecting electrode portions are disposed in overlapping positions in the stacking direction via the interlayer insulating layer.

* * * * *